United States Patent
Itabashi et al.

(10) Patent No.: US 9,224,563 B2
(45) Date of Patent: Dec. 29, 2015

(54) ELECTRONIC PART AND ELECTRONIC CONTROL UNIT

(71) Applicants: DENSO CORPORATION, Kariya, Aichi-pref. (JP); Murata Manufacturing Co., Ltd., Nagaokakyo-shi, Kyoto-fu (JP)

(72) Inventors: Toru Itabashi, Anjo (JP); Yuki Mikami, Kariya (JP); Ryoichi Shiraishi, Okazaki (JP); Akihiro Yanagisawa, Toyohashi (JP); Shigeki Nishiyama, Nagaokakyo (JP)

(73) Assignees: DENSO CORPORATION, Kariya (JP); Murata Manufacturing Co., Ltd., Nagaokakyo-shi (JP)

( * ) Notice: Subject to any disclaimer, the term of this patent is extended or adjusted under 35 U.S.C. 154(b) by 129 days.

(21) Appl. No.: 14/190,299

(22) Filed: Feb. 26, 2014

(65) Prior Publication Data
US 2014/0240942 A1 Aug. 28, 2014

(30) Foreign Application Priority Data
Feb. 28, 2013 (JP) .................................. 2013-38363

(51) Int. Cl.
*H02B 1/18* (2006.01)
*H01H 85/02* (2006.01)
(Continued)

(52) U.S. Cl.
CPC ............. *H01H 85/0241* (2013.01); *H01G 2/16* (2013.01); *H01G 2/18* (2013.01); *H01H 69/022* (2013.01);
(Continued)

(58) Field of Classification Search
CPC ... H01H 69/022; H01H 85/463; H01H 85/48; H01H 85/50; H01G 2/16; H01G 2/18; H01B 1/18
USPC .............. 361/103, 104, 275.4, 628, 630, 642, 361/646; 337/33, 157, 158, 159, 168
See application file for complete search history.

(56) References Cited

U.S. PATENT DOCUMENTS 5,253,148 A  10/1993 Katsu
5,608,602 A * 3/1997 Kuriyama ............ H01G 9/0003
                                              361/275.1
(Continued)

FOREIGN PATENT DOCUMENTS

JP   H02-276228 A   11/1990
JP   2006-24825 A    1/2006
JP   2007-311467 A  11/2007

OTHER PUBLICATIONS
U.S. Appl. No. 14/190,249, filed Feb. 26, 2014, Mikami et al.
(Continued)

*Primary Examiner* — Hoa C Nguyen
*Assistant Examiner* — Binh Tran
(74) *Attorney, Agent, or Firm* — Posz Law Group, PLC

(57) ABSTRACT

A main body of an electronic part is formed in a rectangular pillared shape having a first and a second axial end surface. A first electrode is formed on the first axial end surface electrically and mechanically connected to a first wiring pattern formed on a board surface of a printed board. A second electrode is formed on the second axial end surface, to which one end of a fuse terminal is electrically connected. The other end of the fuse terminal is connected to a second wiring pattern of the printed board or a wiring member which is formed as an independent member from the printed board. A cut-off portion is formed in a connecting portion of the fuse terminal.

11 Claims, 7 Drawing Sheets

(51) Int. Cl.

| | | |
|---|---|---|
| *H01H 85/50* | (2006.01) | |
| *H01H 85/46* | (2006.01) | |
| *H01G 2/16* | (2006.01) | |
| *H01H 69/02* | (2006.01) | |
| *H01G 2/18* | (2006.01) | |
| *H01H 85/48* | (2006.01) | |
| *H05K 1/18* | (2006.01) | |
| *H05K 1/02* | (2006.01) | |
| *H02H 5/04* | (2006.01) | |
| *H01G 2/00* | (2006.01) | |
| *H02B 1/04* | (2006.01) | |
| *H01H 39/00* | (2006.01) | |
| *H01H 73/24* | (2006.01) | |
| *H01H 71/10* | (2006.01) | |
| *H05K 3/34* | (2006.01) | |
| *H01H 85/10* | (2006.01) | |

(52) U.S. Cl.
CPC ............ *H01H 85/463* (2013.01); *H01H 85/48* (2013.01); *H01H 85/50* (2013.01); *H05K 1/0263* (2013.01); *H05K 1/18* (2013.01); *H01H 85/10* (2013.01); *H01H 2085/0275* (2013.01); *H05K 1/181* (2013.01); *H05K 3/3426* (2013.01); *H05K 2201/10181* (2013.01); *H05K 2201/10454* (2013.01); *H05K 2201/10946* (2013.01)

(56) References Cited

U.S. PATENT DOCUMENTS 5,784,248 A * 7/1998 Tomiyasu ................ H01G 2/04
361/275.4
2012/0200970 A1  8/2012 Itabashi et al.

OTHER PUBLICATIONS

U.S. Appl. No. 14/190,210, filed Feb. 26, 2014, Itabashi et al.
U.S. Appl. No. 14/190,250, filed Feb. 26, 2014, Shiraishi et al.
U.S. Appl. No. 14/190,297, filed Feb. 26, 2014, Kamiya et al.
U.S. Appl. No. 14/190,280, filed Feb. 26, 2014, Murowaki et al.

* cited by examiner

ELECTRONIC PART AND ELECTRONIC CONTROL UNIT

CROSS REFERENCE TO RELATED APPLICATION

This application is based on Japanese Patent Application No. 2013-038363 filed on Feb. 28, 2013, the disclosure of which is incorporated herein by reference.

FIELD OF TECHNOLOGY

The present disclosure relates to an electronic part mounted to a printed board and an electronic control unit having the electronic part.

BACKGROUND

A printed board having a pattern fuse, which is a part of wiring patterns formed in the printed board, is known in the art, for example, as disclosed in Japanese Patent Publication No. 2007-311467.

The pattern fuse is generally so formed as to be narrower than a remaining part of the wiring patterns. Therefore, for example, when a short-circuit occurs in an inside of an electronic device or an electronic part and thereby excess current flows, the pattern fuse is melted down due to heat generation in order that an electric pathway is cut off.

In a case of the pattern fuse, it is necessary to individually design the pattern fuses when the pattern fuses are used for different types of electronic parts or when the pattern fuses are used to the same type of the electronic part but ratings of the electronic parts are different from each other. As a result, it is difficult to commonalize or standardize the printed boards for different types of electronic control units. In other words, it is difficult to commonalize the printed boards and to simply change the electronic parts to be mounted to the printed board in order to use the same type of the printed board for the different types of the electronic control units (variation products).

In addition, it is difficult to make a size of the printed board as well as the electronic control unit smaller, because the pattern fuse (or pattern fuses) is provided on the printed board as a part of the wiring patterns.

In addition, the heat generated at the pattern fuse due to the excess current directly goes away to an insulating board of the printed board neighboring to the pattern fuse or the heat generated at the pattern fuse may indirectly go away to the insulating board via the wiring pattern connected to the pattern fuse. Since the heat of the pattern fuse goes away to the insulating board as above, it is a problem that it may take a longer time from short-circuit in the electronic part to melt-down of the pattern fuse. In other words, it is not possible to quickly cut off the pattern fuse with high response. In addition, since response characteristics vary, it is not possible to assure accuracy of performance for cutting off the pattern fuse.

SUMMARY OF THE DISCLOSURE

The present disclosure is made in view of the above problems. It is an object of the present disclosure to provide an electronic part and an electronic control unit having the electronic part, according to which it is possible to commonalize and/or standardize a printed board, to which the electronic parts are mounted, and to make a size of the printed board smaller. In addition, it is another object of the present disclosure to improve response of cutting-off performance between short-circuit of the electronic part and cut-off of excess current.

According to a feature of the present disclosure, an electronic part mounted to a printed board has:

a main body of a pillared shape, the main body having at least one electronic element;

multiple electrodes respectively formed at outer surfaces of the main body, each of the electrodes being electrically connected to the electronic element; and at least one fuse terminal electrically connected to one of the electrodes.

In the above electronic part, the electrodes are composed of a first electrode formed at a first axial end surface of the main body and a second electrode formed at a second axial end surface of the main body, the first and second axial end surfaces are opposing to each other in an axial direction of the main body.

In the above electronic part, the main body is arranged on the printed board so that the first axial end surface is opposed to a board surface of the printed board, wherein the first electrode is electrically connected to a first wiring pattern formed in the printed board, and wherein the second electrode is electrically connected to a second wiring portion via the fuse terminal.

In the above electronic part, the fuse terminal is composed of;

an electrode-connected portion electrically and mechanically connected to the second electrode;

a wire-connected portion electrically and mechanically connected to the second wiring portion; and a connecting portion extending from the electrode-connected portion in a direction away from the main body and further extending in the axial direction of the main body in order to electrically connect the electrode-connected portion to the wire-connected portion, wherein the connecting portion has a cut-off portion, which has a cross sectional area smaller than that of other portions of the fuse terminal and which is melted down by heat generated by excess current flowing through the cut-off portion.

According to the above feature, since the electronic part has the fuse terminal having the cut-off portion, it is not necessary to form a pattern fuse in the printed board. It is, therefore, possible to commonalize the printed board which can be used for different types of electronic control units.

In addition, it is possible to reduce a size of the printed board and the electronic control unit by such a volume corresponding to the pattern fuse, which can be eliminated in the present disclosure. In particular, according to the present disclosure, the main body of the electronic part is arranged on the printed board in such a way that an axial direction of the main body is perpendicular to the board surface of the printed board. It is, thereby, possible to reduce a mounting area on the board surface for the electronic part. The size of the printed board can be correspondingly reduced.

The cut-off portion is formed in the fuse terminal, which electrically connects the second electrode of the main body to the second wiring portion. Therefore, the cut-off portion is not in contact with the printed board in a condition that the electronic part is mounted to the printed board and thereby the heat generated at the cut-off portion does not directly go away to the printed board. Accordingly, it is possible to shorten a time period between occurrence of the short circuit in the electronic part and the melt down of the cut-off portion. Namely, response is improved. In addition, it is possible to reduce variation of response and thereby improve accuracy for cutting-off performance.

In a case that the response is improved by the pattern fuse, it is necessary to make the pattern fuse thinner than other portions of the wiring patterns or to make the pattern fuse with such material which is more easily melted down than the other portions of the wiring patterns. However, the above method increases manufacturing cost.

According to the present disclosure, since the heat of the cut-off portion is not easily transferred to the printed board, it is possible not only to improve the response but also to reduce the manufacturing cost. Furthermore, since the heat of the cut-off portion is not easily transferred to the printed board, it is possible to loosen up designing of heat-resisting performance for the printed board. The manufacturing cost is correspondingly further reduced.

In addition, since the electronic part is so arranged on the printed board that the first axial end surface of the main body is opposed to the board surface of the printed board, it is possible to reduce an opposing surface area between the main body and the printed board. It is possible to reduce strain in a direction parallel to the board surface, wherein the strain is generated by a difference of coefficient of linear expansion between the printed board and the electronic part. Furthermore, even when the strain is generated in the direction parallel to the board surface, the fuse terminal is elastically deformed so as to absorb the strain. It is, therefore, possible to increase reliability of the electrical connection between each of the electrodes and each of the wiring patterns.

In addition, it is possible to assist by the fuse terminal a positioning of the main body, when the electronic part is arranged on the printed board. It is, therefore, possible to position the main body on the printed board with higher accuracy and to increase the reliability for the electrical connection at respective connecting points.

In the printed board having the pattern fuses, heat generated at electronic parts neighboring to one pattern fuse and/or heat generated at other pattern fuses adjacent to the one pattern fuse is transferred to the one pattern fuse via the insulating board and the wiring patterns. Since the pattern fuse is influenced by the heat generated at portions surrounding the pattern fuse, the pattern fuse may be melted down before the short-circuit fault occurs in the electronic part, in a case of a high-density packaging.

According to the present disclosure, since the cut-off portion is formed in the fuse terminal, the cut-off portion is not easily influenced by the heat of the other electronic parts. It is, therefore, possible to realize the high-density packaging. In other words, the size of the printed board can be reduced and thereby the manufacturing cost can be correspondingly reduced.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENTS

Figure 1:
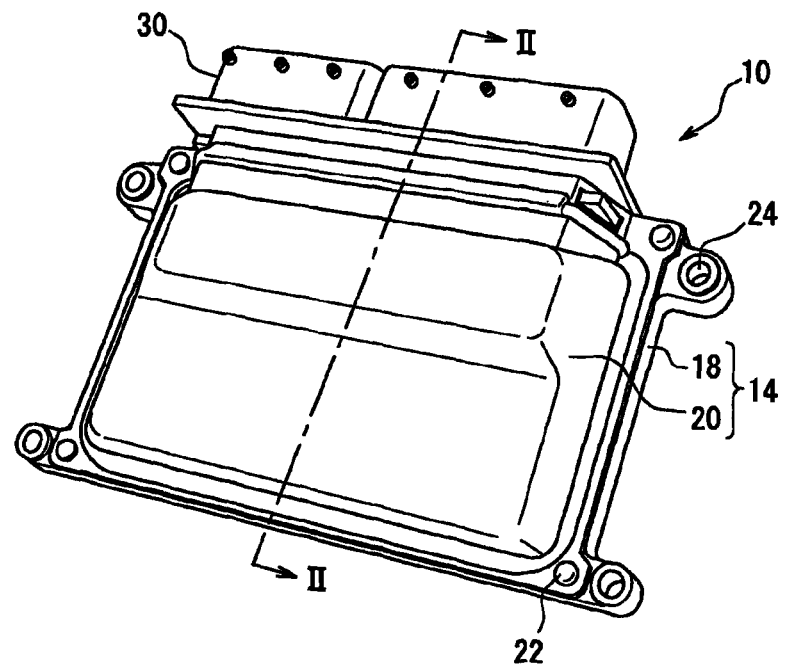
FIG. 1 is a perspective view schematically showing a structure of an electronic control unit according to a first embodiment of the present disclosure.

The present disclosure will be explained hereinafter by way of multiple embodiments. The same reference numerals are given to the same or similar portions and/or structures throughout the embodiments, for the purpose of eliminating repeated explanation.

First Embodiment

Figure 2:
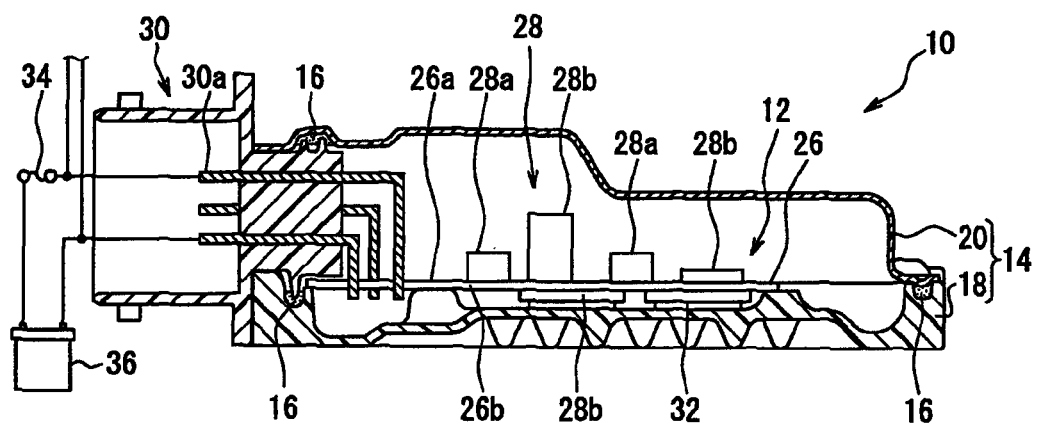
FIG. 2 is a schematic cross sectional view taken along a line II-II in FIG. 1.

An electronic control unit 10 shown in FIGS. 1 and 2 has a circuit board 12 as a main part thereof. The electronic control unit 10 further has a housing 14 for accommodating the circuit board 12 and a seal element 16. In the present embodiment, the electronic control unit 10 is formed as an electronic control unit (ECU) of a water-proof type for controlling an operation of an engine for a vehicle.

An outline structure for the electronic control unit 10 will be hereinafter explained.

The housing 14 is made of metal, such as, aluminum, iron or the like, or resin material, for accommodating therein the circuit board 12 so as to protect the same from water, dust and so on. A number of parts for forming the housing 14 is not limited to a specific number, so that the housing 14 may be composed of one or multiple members.

As shown in FIG. 2, according to the present embodiment, the housing 14 is composed of two parts, that is, a lower casing 18 of a shallow-box shape having an upper open end and an upper casing 20 for closing the upper open end of the lower casing 18. The upper casing 20 is fixed to the lower casing 18 by multiple screws 22 (or bolts) to form an inside space of the housing 14 for accommodating the circuit board 12. In an assembled condition of the housing 14, a portion (or multiple portions) of the circuit board 12 is directly or indirectly interposed between the lower and the upper casings 18 and 20, so that the circuit board 12 is firmly held at a predetermined position inside of the housing 14.

In the present embodiment, the housing 14 is divided into the lower and the upper casings 18 and 20 in a vertical direction (a thickness direction of the circuit board 12). However, a dividing direction for the parts (the lower casing 18 and the upper casing 20) of the housing 14 is not limited to the vertical direction.

Multiple through-holes 24 (four in the present embodiment) are formed at each corner of the lower casing 18 in order that screws or bolts (not shown) are respectively inserted into the through-holes 24 so as to fix the electronic control unit 10 to a predetermined position, for example, to an engine block. An aperture is formed in the housing 14 so that a portion of a connector 30 outwardly protrudes from the inside of the housing 14.

The seal element 16 has a function for preventing water from coming into the inside space of the housing 14. As shown in FIG. 2, the seal element 16 is arranged at a position, at which outer peripheries of the lower and the upper casings 18 and 20 are opposed to each other. The seal element 16 is also arranged at a position, at which the housing 14 and the connector 30 are opposed to each other.

The circuit board 12 is composed of a printed board 26, to which multiple electric or electronic parts and/or components 28 (hereinafter collectively referred to as the electronic parts 28), such as a micro-computer, power transistors, resistors, capacitors and the like are mounted to form electric circuits. The electronic parts 28 are mounted to at least one of board surfaces (a front-side board surface 26a and a back-side board surface 26b) of the printed board 26. In the present embodiment, as shown in FIG. 2, the electronic parts 28 are mounted to both of the board surfaces 26a and 26b of the printed board 26.

For example, multiple electronic parts 28a are mounted to the front-side board surface 26a of the printed board 26, wherein each of the electronic parts 28a has a fuse terminal 54a (FIGS. 3 to 5), as explained below. The electronic parts 28a correspond to those electronic parts requiring the pattern fuses in a conventional device. The electronic parts other than the electronic parts 28a (having the fuse terminal 54a) are designated by 28b (having no fuse terminal) in the drawing, for the sake of convenience.

In addition to the electronic parts 28, the connector 30 is further mounted to the printed board 26 for electrically connecting the electric circuits formed in the circuit board 12 to outside devices (not shown). In FIG. 2, multiple pins 30a of the connector 30 are mounted to the printed board 26 by a through-hole mounting process. However, the pins 30a may be alternatively mounted to the printed board 26 by a surface-mounting process or a surface-mounting structure.

A reference numeral 32 in FIG. 2 designates heat radiation gel arranged between some of the electronic parts 28b and the lower casing 18 and being in contact with them, so as to transfer heat of the electronic parts 28b to the lower casing 18.

In the above-explained electronic control unit 10, an outside connector (not shown) is fitted to the connector 30 (the pins 30a of the connector 30), so that the electronic control unit 10 is electrically connected to a wire harness (not shown). The connector 30 is electrically connected to a battery 36 (a direct current power source) via a main fuse 34 for protecting the electronic control unit 10 from excess current. The battery 36 is also connected to other electronic control units (not shown), such as a brake control ECU, a steering control ECU, a body ECU, a navigation device and so on.

Since the main fuse 34 is provided in a path for supplying electric power necessary for operating the various kinds of the electronic devices, including the electronic control unit 10, a large-size fuse (for example, a fuse element for 15A, 20A or the like) is used for the main fuse 34. The main fuse 34 is melted down by the excess current larger than a predetermined value, when any defect or trouble occurs in any one of the electronic devices (including the electronic control unit 10) and thereby the excess current flows through the main fuse 34. Then, the power supply via the main fuse 34 is cut off to prevent an adverse effect to the other electronic devices.

Figure 3:
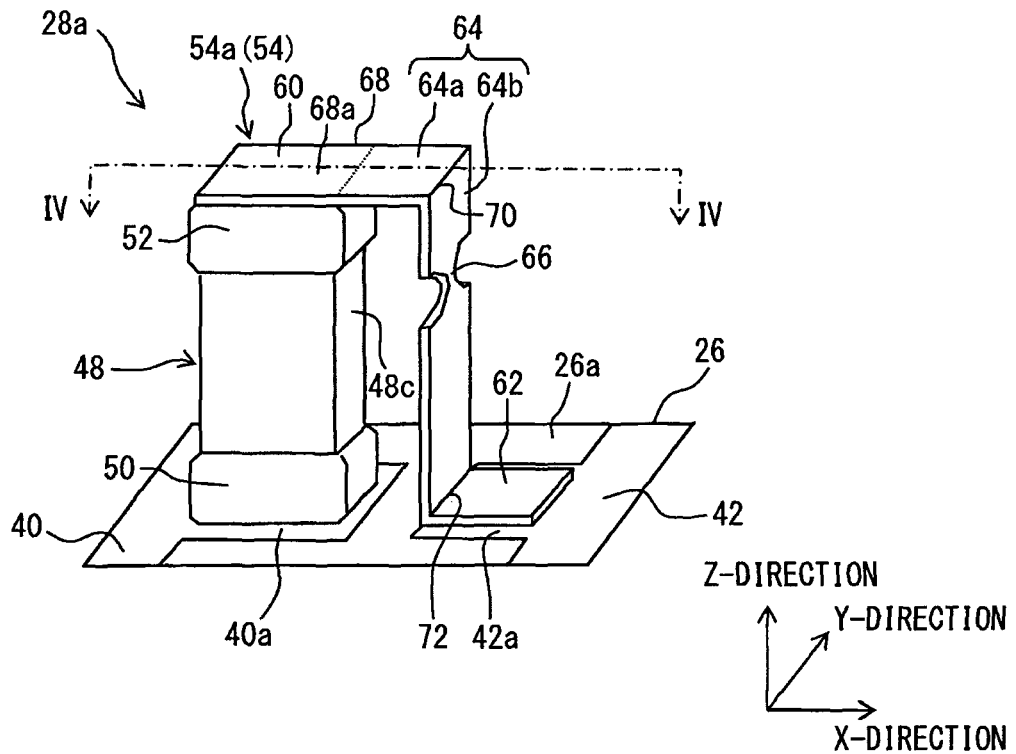
FIG. 3 is a schematically enlarged perspective view showing a portion of a printed board (an electronic part mounted to the printed board)
Figure 4:
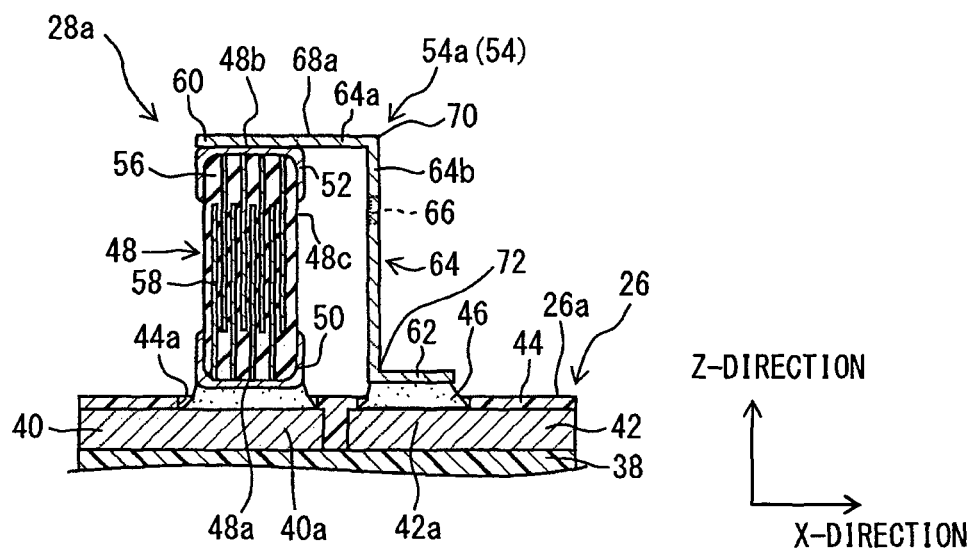
FIG. 4 is a schematic cross sectional view taken along a line IV-IV in FIG. 3.

The circuit board 12, in particular, the electronic part 28a having the fuse terminal 54a, will be explained more in detail with reference to FIGS. 3 to 5. FIGS. 3 and 4 show relevant portions of the circuit board 12, including one of the electronic parts 28a and portions of the circuit board 12 neighboring to the electronic part 28a mounted to the printed board 26. In FIG. 3 a resist 44 (shown in FIG. 4) is eliminated for the sake of convenience.

In the present application, a direction, which is in parallel to the board surface 26a of the printed board 26 and in which the fuse terminal 54a horizontally extends, is referred to as an X-direction. A direction parallel to the board surface 26a and perpendicular to the X-direction is referred to as a Y-direction. A direction perpendicular to the board surface 26a, that is the thickness direction of the printed board 26 is referred to as a Z-direction.

The printed board 26 is composed of an insulating board 38 made of resin or ceramics as its main material, and wiring patterns 40 and 42 made of conducting material (such as cupper) and arranged on the insulating board 38. Although not shown in the drawing, in the present embodiment, the wiring patterns 40 and 42 are formed in a multi-layer structure on the insulating board 38 and the wiring patterns 40 and 42 are formed at both board surfaces of the insulating board 38.

The wiring patterns formed on a board surface of the insulating board 38 (which corresponds to the board surface 26a of the printed board 26) are composed of a first wiring pattern 40 and a second wiring pattern 42. The resist 44 is arranged on the board surface of the insulating board 38 so as to cover the wiring patterns 40 and 42. The resist 44 has openings 44a at predetermined positions. A portion (or portions) of each wiring pattern 40, 42, which is exposed to an outside of the printed board 26 via the corresponding opening 44a of the resist 44, forms a land 40a or 42a connected to the electronic part 28a via solder 46.

The electronic part 28a, which is arranged on the board surface 26a of the printed board 26, has an electronic-element main body 48, multiple (first and second) electrodes 50 and 52, and a terminal 54. In the present embodiments, multiple electronic parts 28a are provided in the electric circuit 12.

The electronic-element main body 48 (hereinafter, the main body 48) has at least one electronic element. At least one of the multiple electronic parts 28a is composed of a ceramic-type capacitor of a laminated structure. As shown in FIG. 4, the main body 48 of the electronic part 28a (the ceramic-type laminated capacitor) has dielectric layers 56 made of high-dielectric ceramics of a barium-titanate type and electric conductor layers 58, wherein the dielectric layers 56 and the electric conductor layers 58 are alternately laminated. The electrodes 50 and 52 are electrically connected to the electric conductor layers 58.

The main body 48 is formed in a pillared shape. The main body 48 has a first and a second axial end surface 48a and 48b in its axial direction. The first electrode 50 is formed at one of axial ends of the main body 48 including the first axial end surface 48a, while the second electrode 52 is formed at the other axial end of the main body 48 including the second axial end surface 48b. More exactly, in the present embodiment, the main body 48 is formed in a square pillared shape. The first electrode 50 is integrally formed on the first axial end surface 48a and four side surfaces at one axial end of the main body 48. In a similar manner, the second electrode 52 is integrally formed on the second axial end surface 48b and four side surfaces at the other axial end of the main body 48.

The main body 48 is arranged on the board surface 26a of the printed board 26 in such a way that the first axial end surface 48a is opposed to the board surface 26a. In other words, the main body 48 is provided on the board surface 26a, so that the axial direction of the main body 48 coincides with the Z-direction. More exactly, the first axial end surface 48a of the main body 48 faces to the board surface 26a and the first axial end surface 48a (which is a main part of the first electrode 50) is mechanically and electrically connected to the land 40a of the first wiring pattern 40 via the solder 46.

The terminal 54 (that is, the fuse terminal 54a) is connected to the second electrode 52 via solder (not shown). The solder for connecting the fuse terminal 54a to the second electrode 52 has a higher melting point than that of the solder 46 for connecting the fuse terminal 54a to the land 42a, so that the solder at the second electrode 52 is not melted down in a reflow soldering process of the solder 46.

The fuse terminal 54a is made by punching out a metal sheet to a predetermined shape and by bending such punched-out metal sheet to a predetermined three-dimensional shape. The fuse terminal 54a has an electrode-connected portion 60, a land-connected portion 62 and a connecting portion 64. The electrode-connected portion 60 is mechanically and electrically connected to the second electrode 52 via the solder. The land-connected portion 62 is mechanically and electrically connected to the land 42a of the second wiring pattern 42 via the solder 46. The connecting portion 64 extends from the electrode-connected portion 60 in the X-direction away from the main body 48 and further extends in the Z-direction (in parallel to the main body 48), so that the connecting portion 64 connects the electrode-connected portion 60 to the land-connected portion 62. The connecting portion 64 has a cut-off portion 66, a cross sectional area of which is made smaller than that of other portions of the fuse terminal 54a. The cut-off portion 66 is melted down depending on heat generated by excess current in order to cut off the excess current.

In the present embodiment, as explained above, the fuse terminal 54a is made of the metal sheet having a constant thickness. The metal sheet is punched out to the predetermined shape and bent to the predetermined three-dimensional shape.

The electrode-connected portion 60 has a rectangular shape on a plane defined by the X-direction and the Y-direction, so that the rectangular shape corresponds to the second axial end surface 48b of the main body 48 for the second electrode 52. The electrode-connected portion 60 is connected to the second axial end surface 48b, in such a way that a thickness direction of the electrode-connected portion 60 coincides with the Z-direction. The connecting portion 64 horizontally extends from the electrode-connected portion 60 in the X-direction. A first connecting part 64a of the connecting portion 64 and the electrode-connected portion 60 form a flat plate portion 68. A thickness direction of the flat plate portion 68 coincides with the Z-direction (that is, the axial direction of the main body 48). An upper-side surface 68a of the flat plate portion 68 is perpendicular to the Z-direction.

The connecting portion 64 is bent by an angle of 90 degrees at a first bent portion 70 to form a second connecting part 64b, which extends from the flat plate portion 68 in the Z-direction and has a height substantially equal to that of the main body 48. A thickness direction of the second connecting part 64b corresponds to the X-direction. The second connecting part 64b is so arranged as to oppose to a side surface 48c of the main body 48 with a predetermined distance from the main body 48.

The fuse terminal 54a has a second bent portion 72 between the second connecting part 64b and the land-connected portion 62. Namely, the land-connected portion 62 is bent at the second bent portion 72 by an angle of 90 degrees with respect to the second connecting part 64b. The land-connected portion 62 extends in the X-direction and in a direction away from the main body 48.

The cut-off portion 66 is formed in the second connecting part 64b at a position away from the first and second bent portions 70 and 72. A width of the cut-off portion 66 is made smaller than that of other portions of the fuse terminal 54a, so that the cut-off portion 66 is melted down due to heat generated by excess current in order to cut off the excess current. The width is a dimension of the cut-off portion 66 in a direction perpendicular to both of a current flow direction in the fuse terminal 54a and a thickness direction of the fuse terminal 54a (that is, a dimension in the Y-direction). Since the fuse terminal 54a is made of the metal plate having a predetermined constant thickness by punching out and bending it to the predetermined shape, a cross sectional area of the cut-off portion 66 is made smaller in a cross section perpendicular to the current flow direction than that of the other portions of the fuse terminal 54a.

Figure 5:
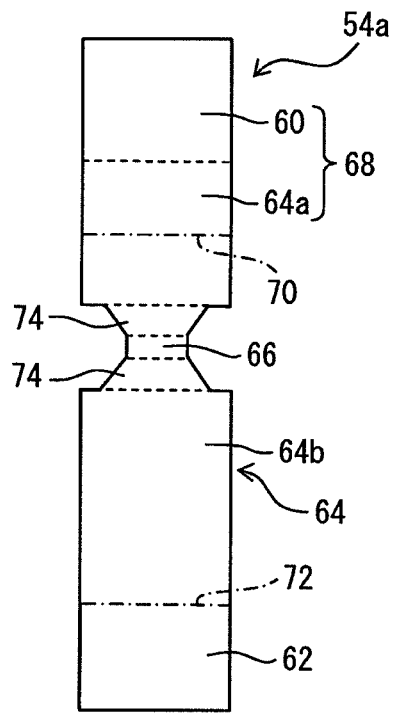
FIG. 5 is a schematic development view showing a fuse terminal.

FIG. 5 is a development view showing the fuse terminal 54a. In the present embodiment, intermediate portions of a rectangular metal plate are cut away so as to form the cut-off portion 66. The metal plate is bent at the first and second bent portions 70 and 72, which are indicated by one-dot-chain lines, so that the fuse terminal 54a is formed in a crank shape.

As shown in FIG. 5, tapered portions 74 are formed at both sides of the cut-off portion 66. Each of the tapered portions 74 has a width which is increased toward the first connecting part 64a or the second connecting part 64b. In the present embodiment, a width of the fuse terminal 54a is constant, except for the cut-off portion 66 and the tapered portions 74.

As shown in FIG. 3, the fuse terminal 54a of the electronic part 28a is electrically connected to the second wiring pattern 42 via the solder 46. The second wiring pattern 42 corresponds to a part of the wiring patterns 40, which is commonly used for multiple electronic parts 28 (including the electronic part 28a). The second wiring pattern 42 is electrically connected to the battery 36 via the pin 30a of the connector 30.

Advantages of the electronic part 28a and the electronic control unit 10 of the present embodiment will be explained.

Figure 6:
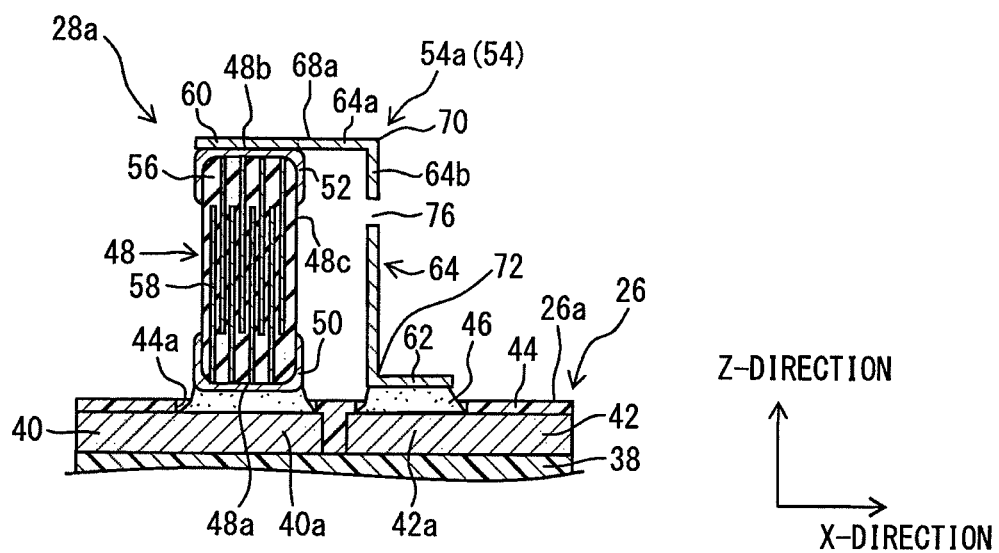
FIG. 6 is a schematic cross sectional view showing a condition in which a cut-off portion is melted down, wherein FIG. 6 corresponds to FIG. 4.

In the present embodiment, the fuse terminal 54a is connected to the second electrode 52 of the electronic part 28a, so that the second electrode 52 is electrically connected to the land 42a of the second wiring pattern 42 via the fuse terminal 54a. For example, when short-circuit occurs in the electronic part 28a and thereby the excess current (short-circuit current) flows, the heat is generated at the cut-off portion 66 having the smaller width depending on the excess current. And when temperature at the cut-off portion 66 becomes higher than a predetermined value, the cut-off portion 66 is melted down and a gap 76 is formed at the cut-off portion 66, as shown in FIG. 6. As a result, the electrical connection between the second electrode 52 and the land 42a of the second wiring pattern 42 is cut off. Accordingly, it is possible to quickly cut off the electrical connection between the second electrode 52 and the land 42a (which are connected to each other by the fuse terminal 54a before its melt-down) when the excess current flows through the fuse terminal 54a.

As above, the function for cutting off the excess current (the short-circuit current) caused by a short-circuit fault of the electronic part 28a is realized not by a pattern fuse formed in the printed board 26 but by the fuse terminal 54a for the electronic part 28a. As a result, it becomes possible to commonalize and/or standardize the printed boards 26, which can be commonly used for the different types of the electronic control units. Therefore, it is possible to provide variation products, for which the same printed boards 26 can be used but different electronic parts 28*a* are mounted to the printed board.

In addition, it is possible to make the size of the printed board 26 as well as the electronic control unit 10 smaller by such a volume corresponding to the pattern fuse, which is not necessary in the present embodiment. In particular, according to the present embodiment, the electronic part 28*a* is mounted to the printed board 26 in such a way that the axial direction of the main body 48 is perpendicular to the board surface 26*a* of the printed board 26. Since a mounting area on the board surface 26*a* for the electronic part 28*a* can be made smaller, the size of the printed board 26 can be correspondingly made smaller.

In addition, the cut-off portion 66 is formed in the fuse terminal 54*a*, which connects the second wiring pattern 42 formed on the board surface 26*a* of the printed board 26 to the second electrode 52 located at the position above the board surface 26*a*. Therefore, since the cut-off portion 66 is not in contact with the printed board 26 in the condition that the electronic part 28*a* is mounted to the printed board 26, the heat generated at the cut-off portion 66 does not directly go away to the printed board 26. As a result, it is possible to shorten a time period between occurrence of the short circuit and the melt-down of the cut-off portion 66. Response is thereby improved. In addition, variation for the response can be reduced and accuracy for cutting-off performance can be increased.

In a case that the response is improved by the pattern fuse, it is necessary to make the pattern fuse thinner than other portions of the wiring patterns or to make the pattern fuse with such material which is more easily melted down than the other portions of the wiring patterns. However, the above method increases manufacturing cost.

According to the present embodiment, since the heat of the cut-off portion 66 is not easily transferred to the printed board 26, it is possible not only to improve the response but also to reduce the manufacturing cost. Furthermore, since the heat of the cut-off portion 66 is not easily transferred to the printed board 26, it is possible to loosen up designing of heat-resisting performance for the printed board 26. The manufacturing cost is correspondingly further reduced.

In addition, since the main body 48 is directly arranged on the printed board 26 so that the first axial end surface 48*a* is opposed to the board surface 26*a* of the printed board 26, an opposing area between the main body 48 and the printed board 26 can be made smaller. It is possible to reduce strain in a direction parallel to the board surface 26*a*, wherein the strain is generated by a difference of coefficient of linear expansion between the printed board 26 and the electronic part 28*a*. Furthermore, even when the strain is generated in the direction parallel to the board surface 26*a*, for example, in the X-direction, the fuse terminal 54*a* is elastically deformed so as to absorb the strain. It is, therefore, possible to increase reliability of the electrical connection between the first electrode 50 and the first wiring pattern 40 and between the second electrode 52 and the second wiring pattern 42.

In addition, it is possible to assist by the fuse terminal 54*a* a positioning of the main body 48, when the electronic part 28*a* is arranged on the printed board 26. In other words, a number of contacting points, at which the main body 48 is brought into contact with the printed board 26, is increased by the fuse terminal 54*a*. It is, therefore, possible to position the main body 48 on the printed board 26 with higher accuracy and to increase the reliability for the electrical connection at respective connecting points.

The electrode-connected portion 60 of the fuse terminal 54*a* is connected to the second electrode 52 formed at the second axial end surface 48*b* of the main body 48. Since the electrode-connected portion 60 is arranged on a longitudinal axial line of the main body 48, it is possible to position the main body 48 with respect to the printed board 26 with high accuracy.

The fuse terminal 54*a* has the flat plate portion 68 including the electrode-connected portion 60 and the upper-side surface 68*a* of the flat plate portion 68 is perpendicular to the Z-direction. Since the upper-side surface 68*a* of the flat plate portion 68 can stick to a part-mounting device in existence (in other words, the flat plate portion 68 can be held by the part-mounting device), the electronic part 28*a* can be positioned on the printed board 26 by use of such a conventional mounting device.

Since the main body 48 is arranged on the printed board 26 in such a way that the axial direction of the main body 48 is perpendicular to the printed board 26 and the flat plate portion 68 is stably supported by the second axial end surface 48*b* of the main body 48, the present embodiment has an advantage in that the re-connection of the fuse terminal can be effectively prevented after the cut-off portion 66 is melted down.

In the printed board having the pattern fuses, heat generated at electronic parts neighboring to one pattern fuse and/or heat generated at other pattern fuses adjacent to the one pattern fuse is transferred to the one pattern fuse via the insulating board and the wiring patterns. Since the pattern fuse is influenced by the heat generated at portions surrounding the pattern fuse, the pattern fuse may be melted down before the short-circuit fault occurs in the electronic part, in a case of a high-density packaging.

According to the present embodiment, however, since the cut-off portion 66 is held at the position above and separated from the front-side board surface 26*a*, the cut-off portion 66 is not easily influenced by the heat of the other electronic parts 28. It is, therefore, possible to realize the high-density packaging. In other words, the size of the printed board 26 can be reduced and thereby the manufacturing cost can be correspondingly reduced.

In the electronic control unit 10, at least some of the multiple electronic parts 28*a* having the fuse terminals 54*a* are connected to the second wiring pattern 42 (which is a power-source wiring pattern). As already explained above, when the short-circuit fault occurs in one of the electronic parts 28*a* and the excess current flows in the fuse terminal 54*a*, the connection between the second electrode 52 and the second wiring pattern 42 is immediately cut off by the melt-down of the cut-off portion 66 of the fuse terminal 54*a* (which has connected the second electrode 52 and the second wiring pattern 42). Accordingly, it is possible to protect the other electronic parts 28 connected to the second wiring pattern 42 from the excess current.

The excess current flowing in the fuse terminal 54*a* for cutting off the cut-off portion 66 is not so large as the excess current for cutting off the main fuse 34. Therefore, it is possible to suppress adverse influence, which may be caused by the excess current flowing in the fuse terminal 54*a*, to power-supply to the other electronic devices.

In the present embodiment, the electronic part 28*a* includes the ceramic-type laminated capacitor. In a case that the electronic part 28*a* of the laminated structure is used, the size of the electronic part 28*a* can be made smaller and the high-density packaging for the printed board 26 can be realized.

However, on the other hand, the electronic part having the laminated structure may have a problem that the electric conductor layers 58 (which are laminated in multiple layers) are likely to be short-circuited by vehicle vibration and/or heat stress. In the present embodiment having the electronic part 28a of the laminated structure, however, it is possible to rapidly cut off the connection between the second electrode 52 and the second wiring pattern 42, if the short-circuit fault occurs.

The battery of a lithium system is more advantageous than a lead battery in view of power supplying capability. On the other hand, the lithium battery has a disadvantage in that it will be quickly deteriorated when current larger than a rated output current is supplied to electric loads. According to the present embodiment, however, the electrical connection between the second electrode 52 and the second wiring pattern 42 is immediately cut off by the fuse terminal 54a in the case of short-circuit in the electronic part 28a. It is, therefore, possible to suppress adverse influence to the battery to a minimum value.

Figure 7:
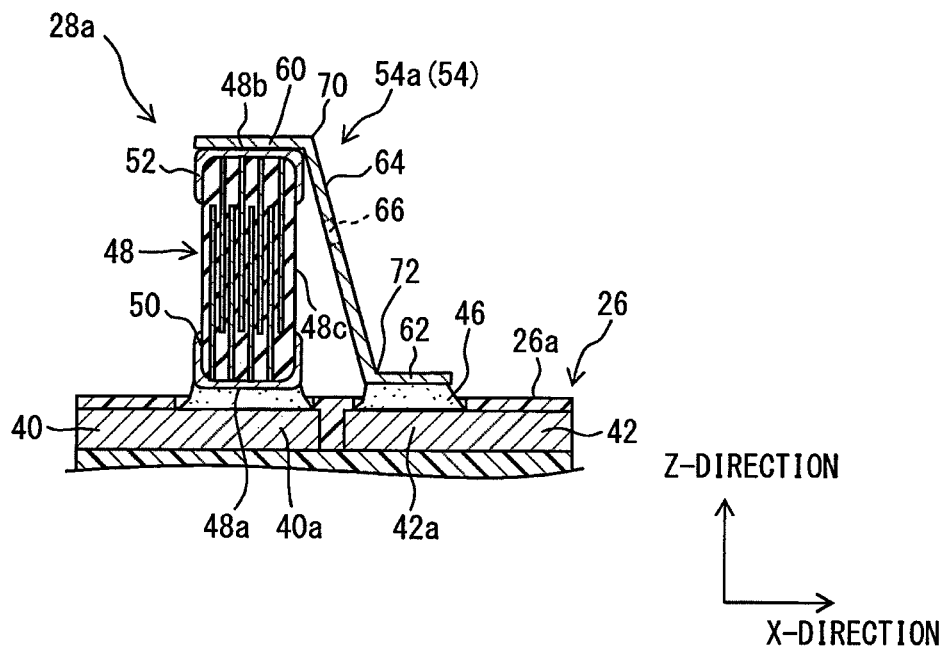
FIG. 7 is a schematic cross sectional view showing a first modification, wherein FIG. 7 corresponds to FIG. 4.

The structure and/or the shape of the connecting portion 64 should not be limited to those of the above embodiment. For example, as shown in FIG. 7 (a first modification), the connecting portion 64 for connecting the electrode-connected portion 60 to the land-connected portion 62 may be inclined with respect to the Z-direction.

Figure 8:
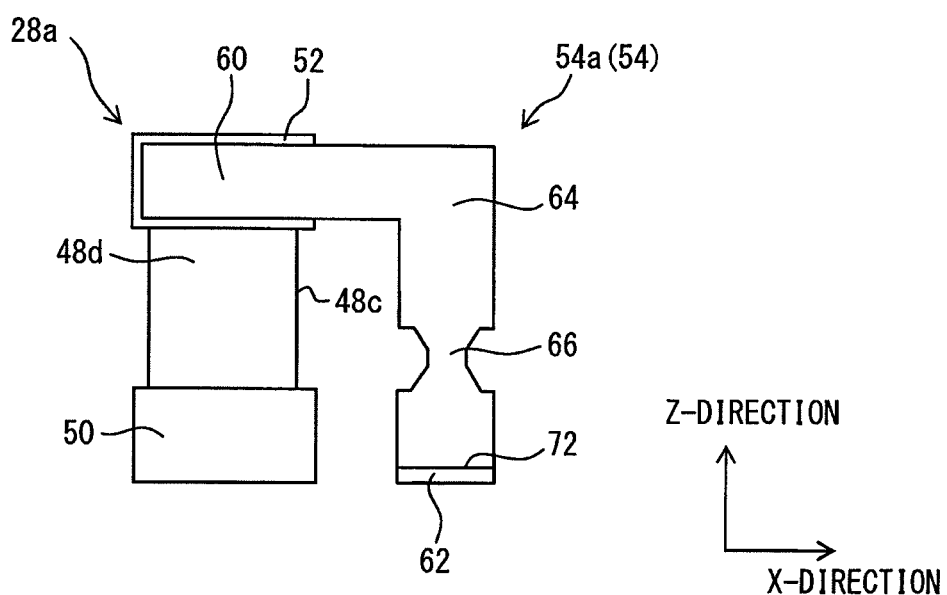
FIG. 8 is a schematic plan view showing a second modification.

A connecting portion of the electrode-connected portion 60, which is connected to the second electrode 52 of the fuse terminal 54a, is not limited to the second axial end surface 48b of the main body 48. For example, as shown in FIG. 8 (a second modification), the electrode-connected portion 60 may be connected to the second electrode 52 formed at a side surface 48d of the main body 48. The side surface 48d corresponds to one of four side surfaces of the main body 48 and next to the side surface 48c. As shown in FIG. 8, in the second modification, the electrode-connected portion 60 and the connecting portion 64 are made of a flat metal plate and formed in an L-letter shape. A thickness direction of the flat metal plate corresponds to the Y-direction. The land-connected portion 62 is bent by an angle of 90 degrees with respect to the connecting portion 64, so that a thickness direction of the land-connected portion 62 corresponds to the Z-direction. In addition, the land-connected portion 62 extends in the Y-direction. Furthermore, the electrode-connected portion 60 may be connected to the other side surface (for example, the side surface 48c) than the side surface 48d.

Figure 9:
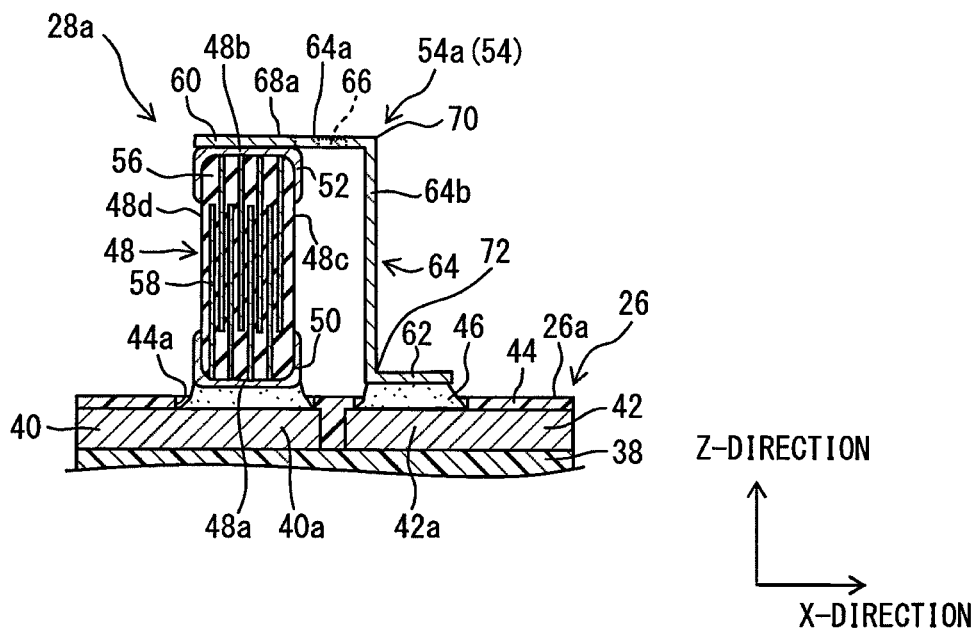
FIG. 9 is a schematic cross sectional view showing a third modification, wherein FIG. 9 corresponds to FIG. 4.

A position for the cut-off portion 66 is not limited to the second connecting part 64b. For example, as shown in FIG. 9 (a third modification), the cut-off portion 66 may be formed in the first connecting part 64a of the connecting portion 64.

Second Embodiment

A second embodiment of the present disclosure will be explained with reference to FIG. 10. Explanation for those portions, which are similar to or the same to those of the first embodiment (including the electronic part 28a, the electronic control unit 10 and so on), will be omitted.

Figure 10:
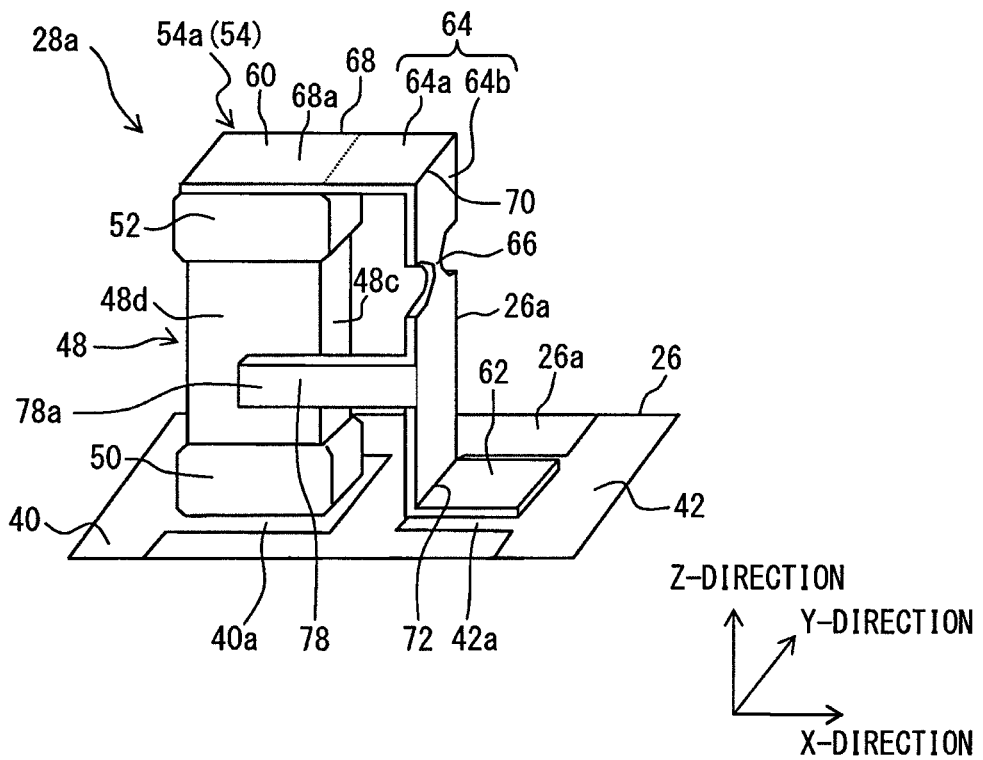
FIG. 10 is a schematically enlarged perspective view showing a portion of a printed board according to a second embodiment of the present disclosure, wherein FIG. 10 corresponds to FIG. 3.

As shown in FIG. 10, the second embodiment has a first technical feature different from the first embodiment, according to which an arm portion 78 is provided in the fuse terminal 54a. In addition, the second embodiment has a second technical feature different from the first embodiment, according to which the cut-off portion 66 is formed in the connecting portion 64 between the first connecting part 64a and the arm portion 78, that is, at a position closer to the electrode-connected portion 60.

The arm portion 78 extends from the second connecting part 64b of the connecting portion 64 in the X-direction, that is, a direction perpendicular to the second connecting part 64b of the connecting portion 64. A forward end 78a of the arm portion 78 is in contact with a portion of the side surface 48d of the main body 48, at which the first and second electrodes 50 and 52 are not formed. In the present embodiment, the arm portion 78 is formed as a part of the fuse terminal 54a, namely a part of the metal plate forming the electrode-connected portion 60, the land-connected portion 62 and the connecting portion 64. The arm portion 78 is bent by an angle of 90 degrees with respect to the second connecting part 64b and extends in the X-direction toward the main body 48. The arm portion 78 is in contact with one of side surfaces of the main body 48, that is, the side surface 48d next to the side surface 48c opposing to the second connecting part 64b.

According to the above structure, the electronic part 28a is arranged on the printed board 26 in a condition that the arm portion 78 is in contact with the main body 48. Since the arm portion 78 is in contact with the main body 48, a relative position is not easily displaced between the main body 48 (having the electrodes 50 and 52) and the fuse terminal 54a, in particular between the first electrode 50 and the land-connected portion 62. It is, therefore, possible to accurately position the main body 48 by the fuse terminal 54a with respect to the printed board 26, before the electronic part 28a is soldered to the printed board 26.

The arm portion 78 remains in contact with the main body 48 even after the electronic part 28a is soldered to the printed board 26. Therefore, even when any external force is applied to the connecting portion 64 of the fuse terminal 54a, the connecting portion 64 is not easily deformed. As above, the deformation of the fuse terminal 54a (the connecting portion 64 thereof) can be prevented by the arm portion 78 after the electronic part 28a and the fuse terminal 54a are soldered to the printed board 26.

As explained above, the cut-off portion 66 is formed in the second connecting part 64b at the position between the electrode-connected portion 60 and the arm portion 78, that is, the position closer to the electrode-connected portion 60 than the arm portion 78. The arm portion 78 remains in contact with the main body 48 after the cut-off portion 66 is melted down by the excess current. A relative position is hardly displaced between the fuse terminal 54a (the land-connected portion 62 and the arm portion 78) and the main body 48 (having the first and second electrodes 50 and 52) even after the melt-down of the fuse terminal 54a. More exactly, a remaining portion of the fuse terminal 54a after the melt down (that is, an upper portion of the fuse terminal 54a) is connected to the second electrode 52. The other portion of the fuse terminal 54a after the melt down (that is, a lower portion of the fuse terminal 54a) is connected to the land 42a and the arm portion 78 is in contact with the main body 48. Therefore, a relative position is hardly displaced between the upper portion and the lower portion of the fuse terminal 54a so that the re-connection of the melted-down fuse terminal 54a is prevented.

Figure 11:
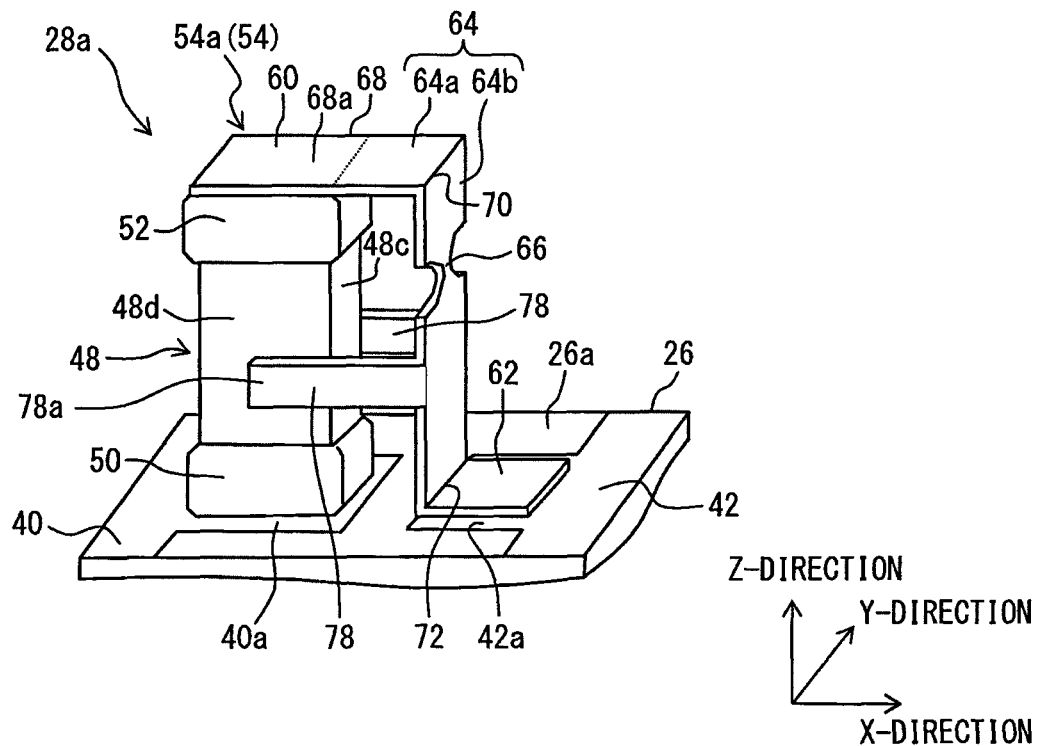
FIG. 11 is a schematically enlarged perspective view showing a fourth modification, wherein FIG. 11 corresponds to FIG. 3.

A number of the arm portion 78 should not be limited to one. As shown in FIG. 11 (a fourth modification), a pair of arm portions 78 may be provided in the fuse terminal 54a and each of the arm portions 78 is in contact with respective side surface of the main body 48, wherein the side surfaces are opposed to each other in the Y-direction. In FIG. 11, one of the arm portions 78 is in contact with the side surface 48d of the main body 48, while the other of the arm portions 78 is in contact with the side surface, which is located on an opposite side of the side surface 48d. According to the structure of the fourth modification, it is possible to more accurately position the main body 48 on the printed board 26, before the electronic part 28a is soldered to the printed board 26. In addition, it is possible to more effectively prevent the deformation of the fuse terminal 54a (the connecting portion 64 thereof) after the electronic part 28a and the fuse terminal 54a are soldered to the printed board 26. As a result, the re-connection of the melted-down fuse terminal 54a can be more effectively prevented.

In the present embodiment, as shown in FIG. 11, the cut-off portion 66 is formed in the connecting portion 64 between the arm portions 78 and the electrode-connected portion 60. However, it may be further modified so that the cut-off portion 66 is formed in the connecting portion 64 between the arm portions 78 and the land-connected portion 62.

Third Embodiment

A third embodiment will be explained with reference to FIG. 12. Explanation for those portions, which are similar to or the same to those of the first and/or second embodiments (including the electronic part 28a, the electronic control unit 10 and so on), will be omitted.

Figure 12:
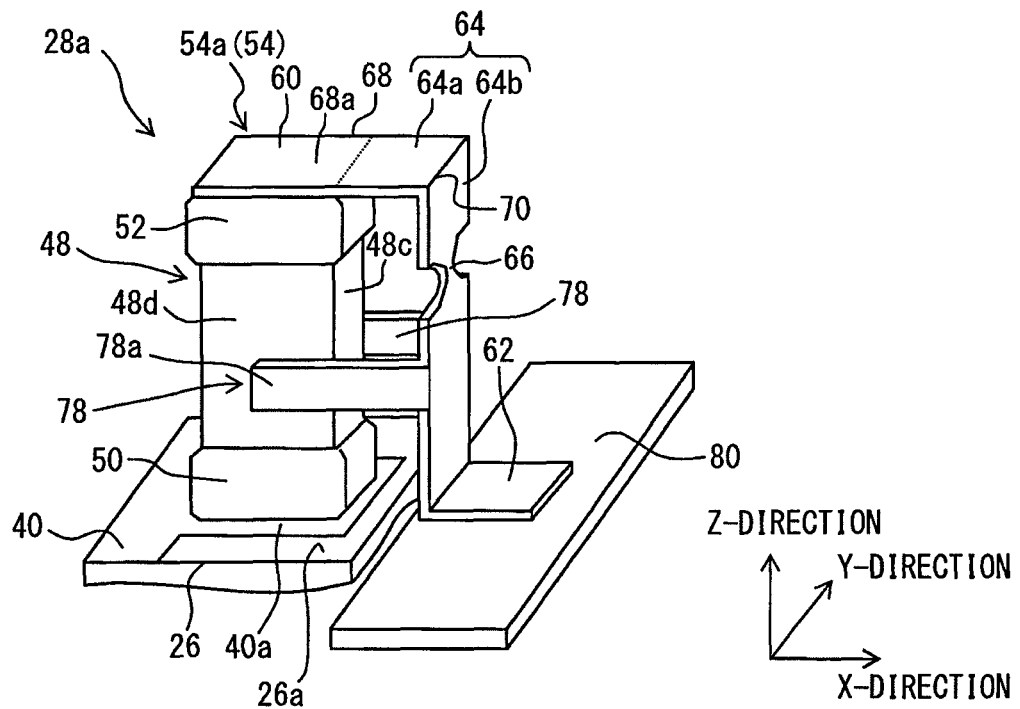
FIG. 12 is a schematically enlarged perspective view showing a portion of a printed board according to a third embodiment of the present disclosure, wherein FIG. 12 corresponds to FIG. 3.

As shown in FIG. 12, a wiring member 80 is provided in a place of the second wiring pattern 42 of the second embodiment, wherein the wiring member 80 is made as an independent part from the printed board 26. The other portions and structure of the third embodiment are the same to those of the second embodiment (the fourth modification shown in FIG. 11).

The wiring member 80 is, for example, a bus bar made of metal through which large current flows. The land-connected portion 62 of the fuse terminal 54a is connected (soldered) to the wiring member 80. The wiring member 80 (FIG. 12) and the second wiring pattern 42 (for example, FIG. 11) are collectively referred to as a second wiring portion. In FIG. 12, a reference numeral 62 designates a wiring-member connected portion, which corresponds to the land-connected portion 62 of the above embodiments or modifications (for example, FIG. 11). The land-connected portion 62 (FIGS. 1 to 11) and the wiring-member connected portion 62 (FIG. 12) are collectively referred to as a wire-connected portion.

According to the above structure, it is possible that spring deformation of the fuse terminal 54a can absorb variation of the relative position in the X-direction between the printed board 26 and wiring member 80, which is made as the separate member from the printed board 26. The spring deformation of the fuse terminal 54a can also absorb displacement of the wiring member 80 with respect to the printed board 26, which is caused by increase of ambient temperature. It is, therefore, possible to increase reliability for the electrical connection between the first wiring pattern 40 and the first electrode 50 as well as the electrical connection between the wiring member 80 and the second electrode 52.

In the third embodiment shown in FIG. 12, the wiring member 80 is applied to the second embodiment (the fourth modification) shown in FIG. 11. The wiring member 80 can be applied to the other embodiments and/or the other modifications.

The present disclosure is explained with reference to the above embodiments and the modifications. However, the present disclosure should not be limited to the above embodiments and/or the modifications, but can be further modified in various manners without departing from spirits of the present disclosure.

Figure 13:
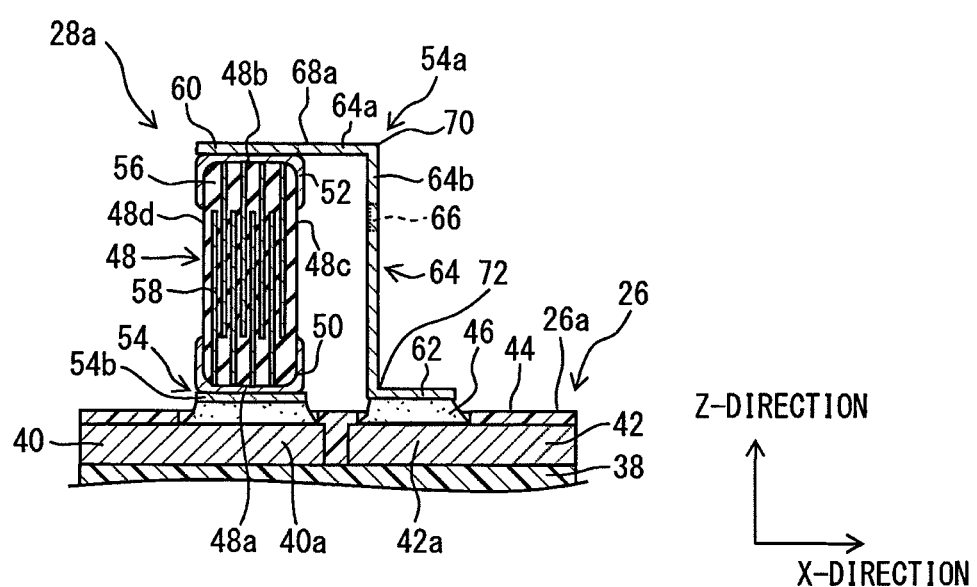
FIG. 13 is a schematic cross sectional view showing a fifth modification, wherein FIG. 13 corresponds to FIG. 4.

In the above embodiments and modifications, the electronic part 28a has one fuse terminal 54a as the terminal. However, as shown in FIG. 13 (a fifth modification), a normal terminal 54b may be provided on a side to the first electrode 50. The normal terminal 54b corresponds to such a terminal having no cut-off portion. In the modification shown in FIG. 13, the normal terminal 54b made of a flat metal is connected to the first electrode 50 formed on the first axial end surface 48a by solder (not shown). According to the above structure, it is possible to stably arrange the main body 48 on the board surface 26a of the printed board 26, even when the first axial end surface is not formed in a flat shape.

In the above embodiments and modifications, the cut-off portion 66 is made by making the width of the fuse terminal 54a smaller. However, the thickness of the fuse terminal 54a may be made smaller so as to form the cut-off portion 66.

In the above embodiments and modifications, the ceramic-type laminated capacitor is explained as the example for the electronic part 28a. However, the above structure for the electronic part may be applied to any other types of the electronic elements. For example, a laminated inductor may be used as the electronic element having the laminated structure.

In addition, the above structure for the electronic part may be applied to any other types of the electronic elements, which include not only the laminated structure but also such a structure of a pillared main body. The pillared main body 48 has the first electrode 50 at the first axial end surface 48a and the second electrode 52 at the second axial end surface 48b. Furthermore, the above structure can be applied to such an electronic part, a main body of which has multiple electronic elements such as a multiple chip resistor.

In the above embodiments and modifications, the fuse terminal 54a is electrically connected to the second wiring pattern 42, which corresponds to a power-source wiring line electrically connected to the battery 36. The second wiring pattern 42, to which the electronic part 28a having the fuse terminal 54a is connected, is not limited to the power-source wiring line.

What is claimed is:

1. An electronic part mounted to a printed board comprising:
    a main body of a pillared shape, the main body having at least one electronic element;
    multiple electrodes respectively formed at outer surfaces of the main body, each of the electrodes being electrically connected to the electronic element; and
    at least one fuse terminal electrically connected to one of the electrodes,
    wherein the electrodes are composed of a first electrode formed at a first axial end surface of the main body and a second electrode formed at a second axial end surface of the main body, the first and second axial end surfaces are opposing to each other in an axial direction of the main body,
    wherein the main body is arranged on the printed board in such a way that the first axial end surface is opposed to a board surface of the printed board,
    wherein the first electrode is electrically connected to a first wiring pattern formed in the printed board,
    wherein the second electrode is electrically connected to a second wiring portion via the fuse terminal,
    wherein the fuse terminal is composed of;
    an electrode-connected portion electrically and mechanically connected to the second electrode;
    a wire-connected portion electrically and mechanically connected to the second wiring portion; and
    a connecting portion extending from the electrode-connected portion in a direction away from the main body and further extending in the axial direction of the main body in order to electrically connect the electrode-connected portion to the wire-connected portion, wherein the connecting portion has a cut-off portion, which has a cross sectional area smaller than that of other portions of the fuse terminal and which is melted down by heat generated by excess current flowing through the cut-off portion.

2. The electronic part according to claim 1, wherein the electrode-connected portion of the fuse terminal is connected to the second electrode formed on the second axial end surface of the main body.

3. The electronic part according to claim 2, wherein the fuse terminal has a flat plate portion, in which the electrode-connected portion is formed, an upper-side surface of the flat plate portion is perpendicular to the axial direction of the main body.

4. The electronic part according to claim 1, wherein the fuse terminal has an arm portion, which extends from the fuse terminal in a direction perpendicular to the axial direction of the main body toward the main body, and a forward end of the arm portion is in contact with a side surface of the main body, in which the first and second electrodes are not formed.

5. The electronic part according to claim 4, wherein the cut-off portion is formed in the connecting portion between the electrode-connected portion and the arm portion.

6. The electronic part according to claim 5, wherein the main body is formed in a rectangular pillared shape and has four side surfaces, the fuse terminal has a pair of arm portions, each of which is respectively in contact with the side surfaces of the main body, wherein the side surfaces are opposed to each other.

7. The electronic part according to claim 1, wherein a width of the cut-off portion is smaller than that of other portions of the fuse terminal, wherein the width corresponds to a dimension in a direction perpendicular to a thickness direction of the cut-off portion.

8. The electronic part according to claim 1, wherein the second wiring portion is composed of a wiring pattern formed on a board surface of the printed board.

9. The electronic part according to claim 1, wherein the second wiring portion is composed of an independent wiring member separately formed from the printed board.

10. An electronic control unit comprising:
the electronic part according to claim 8; and
the printed board having a first wiring pattern and a second wiring pattern, wherein a first electrode of the electronic part is electrically connected to the first wiring pattern and a second electrode of the electronic part is electrically connected to the second wiring pattern.

11. An electronic control unit comprising:
the electronic part according to claim 9;
the printed board having the first wiring pattern, to which the first electrode of the electronic part is electrically connected; and
the second wiring portion, which is composed of the independent wiring member separately formed from the printed board and to which the second electrode of the electronic part is electrically connected.

* * * * *